United States Patent
Kim et al.

(10) Patent No.: US 8,110,834 B2
(45) Date of Patent: Feb. 7, 2012

(54) THREE-DIMENSIONAL SEMICONDUCTOR DEVICES INCLUDING SELECT GATE PATTERNS HAVING DIFFERENT WORK FUNCTION FROM CELL GATE PATTERNS

(75) Inventors: Jinho Kim, Gyeonggi-do (KR); Sunghoi Hur, Seoul (KR); Hansoo Kim, Gyeonggi-do (KR); Younggoan Jang, Gyeonggi-do (KR); Sunil Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 221 days.

(21) Appl. No.: 12/651,727

(22) Filed: Jan. 4, 2010

(65) Prior Publication Data
US 2010/0171163 A1    Jul. 8, 2010

(30) Foreign Application Priority Data
Jan. 5, 2009    (KR) .................. 10-2009-0000396

(51) Int. Cl.
*H01L 29/04*    (2006.01)
(52) U.S. Cl. .................. 257/74; 257/278; 257/E21.614; 257/E27.026
(58) Field of Classification Search ............ 257/74, 257/278, E21.614, E27.026
See application file for complete search history.

(56) References Cited

U.S. PATENT DOCUMENTS

| | | | |
|---|---|---|---|
| 5,994,746 A | 11/1999 | Reisinger et al. | |
| 2008/0099819 A1 | 5/2008 | Kito et al. | |
| 2009/0008722 A1* | 1/2009 | Zhang | 257/390 |
| 2011/0092033 A1* | 4/2011 | Arai et al. | 438/152 |

FOREIGN PATENT DOCUMENTS

| | | |
|---|---|---|
| JP | 11-265997 A | 9/1999 |
| JP | 2007-317874 A | 12/2007 |
| JP | 2008-103429 A | 5/2008 |
| KR | 10-0448293 B1 | 9/2004 |
| KR | 10-2008-0034816 A | 4/2008 |

* cited by examiner

*Primary Examiner* — Evan Pert
*Assistant Examiner* — Scott R Wilson
(74) *Attorney, Agent, or Firm* — Meyers Bigel Sibley & Sajovec, P.A,

(57) ABSTRACT

A three-dimensional semiconductor device includes a vertical channel pattern on the substrate, a plurality of cell gate patterns and a select gate pattern stacked on the substrate along the sidewall of the vertical channel pattern, a charge storage pattern between the vertical channel pattern and the cell gate pattern and a select gate pattern between the vertical channel pattern and the select gate pattern. The select gate pattern has a different work function from the cell gate pattern.

16 Claims, 8 Drawing Sheets

//THREE-DIMENSIONAL SEMICONDUCTOR DEVICES INCLUDING SELECT GATE PATTERNS HAVING DIFFERENT WORK FUNCTION FROM CELL GATE PATTERNS

CROSS-REFERENCE TO RELATED APPLICATION

This application claims priority under 35 USC §119 to Korean Patent Application No. 10-2009-0000396, filed on Jan. 5, 2009, the disclosure of which is hereby incorporated herein by reference in its entirety as if set forth fully herein.

BACKGROUND

This invention relates to microelectronic devices and fabrication methods therefor and, more particularly, to three-dimensional microelectronic devices and fabrication methods therefor.

Microelectronic devices are widely used in many consumer, commercial and other applications. As the integration density of microelectronic devices continues to increase, three-dimensional microelectronic devices may be fabricated, wherein active devices, such as transistors, are stacked on a microelectronic substrate, such as an integrated circuit substrate.

In particular, memory devices are widely used for general storage and transfer of data in computers and other digital products. In some memory devices, a string of memory cells are connected in series. Moreover, in order to increase the integration density of memory devices, three-dimensional or vertical memory devices have been developed, wherein a string of serially connected memory cells is formed by the memory cells vertically being stacked on a face of a substrate, wherein a first memory cell in the string of serially connected memory cells is adjacent the face of the substrate and a last memory cell in the string of serially connected memory cells is remote from the face of the substrate. As used herein, and as conventionally used, the "vertical" direction is generally orthogonal to the face of the substrate, whereas the "horizontal" direction is generally parallel to (extending along) the face of the substrate. By vertically stacking the memory cells to norm the string, increased integration density may be provided. These vertically stacked structures may also be referred to as "three-dimensional" memory devices.

SUMMARY

Embodiments of the present invention can provide three-dimensional semiconductor devices. These three-dimensional semiconductor devices may include a substrate, a vertical channel pattern on the substrate, a plurality of cell gate patterns and a select gate pattern stacked on the substrate along the sidewall of the vertical channel pattern and a charge storage pattern between the vertical channel pattern and the cell gate pattern. The select gate pattern has a different work function from at least one of the cell gate patterns and, in some embodiments, from all of the cell gate patterns.

In some embodiments, the work function of the select gate pattern may be greater than that of the cell gate pattern(s) when charges stored in the charge storage pattern during a program operation are electrons.

In some embodiments, the cell gate pattern and the select gate pattern may contain semiconductors doped with dopants of different conductivity types.

In some embodiments, the charge storage pattern may include a blocking insulating layer adjacent to the cell gate pattern, a tunnel insulating layer adjacent to the vertical channel pattern, and a charge storage layer between the blocking insulating layer and the tunnel insulating layer.

In some embodiments, the select gate pattern is a string select gate pattern that may be stacked on an uppermost pattern among the cell gate patterns and extend in a first direction. A ground select pattern may be further disposed between the substrate and a lowermost pattern among the cell gate patterns. The ground select gate pattern also may have a different work function from at least one of the cell gate patterns and, in some embodiments, from all of the cell gate patterns. A bitline may be further disposed over the select gate line. The bitline may extend in a second direction that is perpendicular to the first direction.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention.

DETAILED DESCRIPTION OF THE EMBODIMENTS

Figure 1:
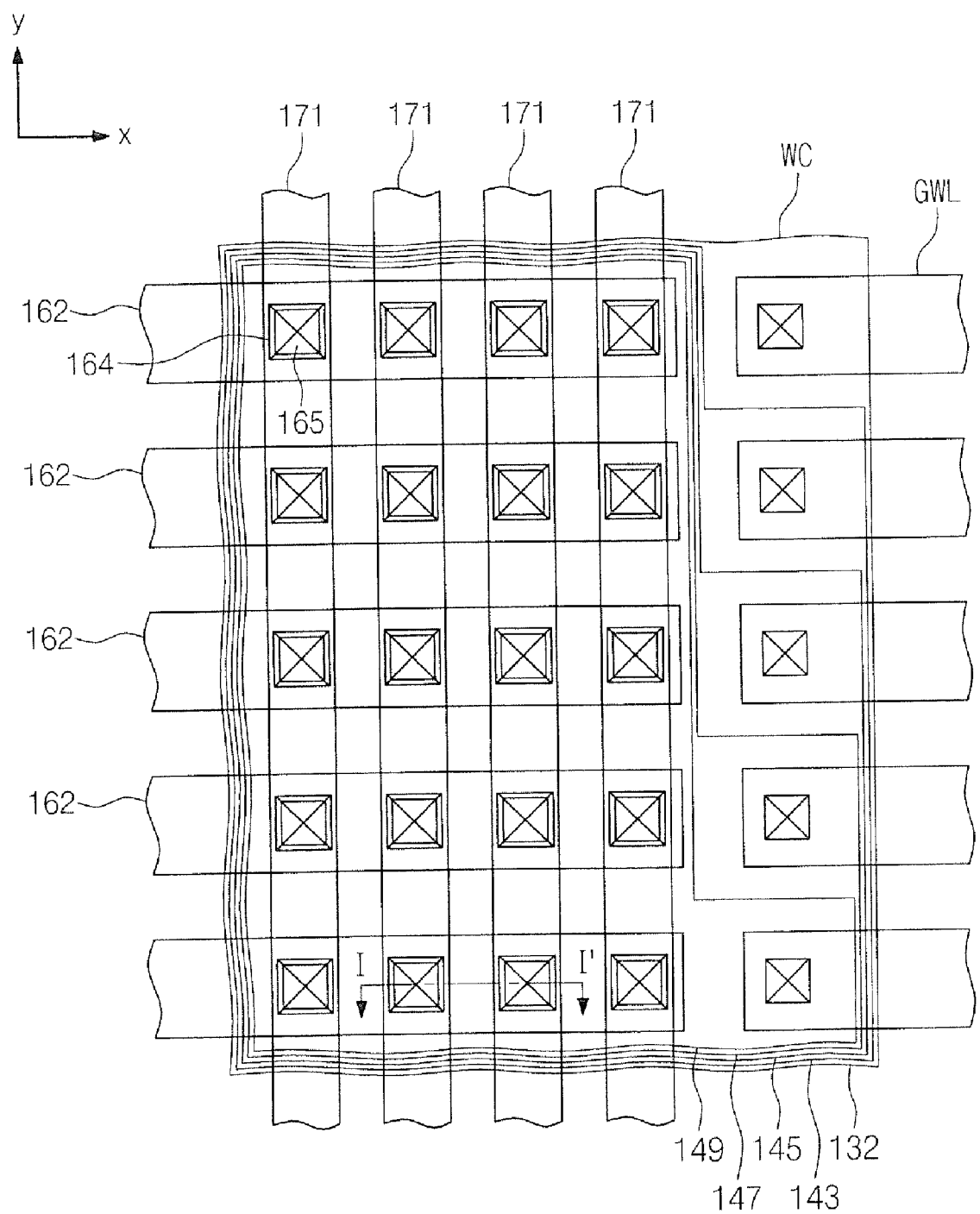
FIG. 1 is a top plan view of a three-dimensional semiconductor device according to embodiments of the present invention.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
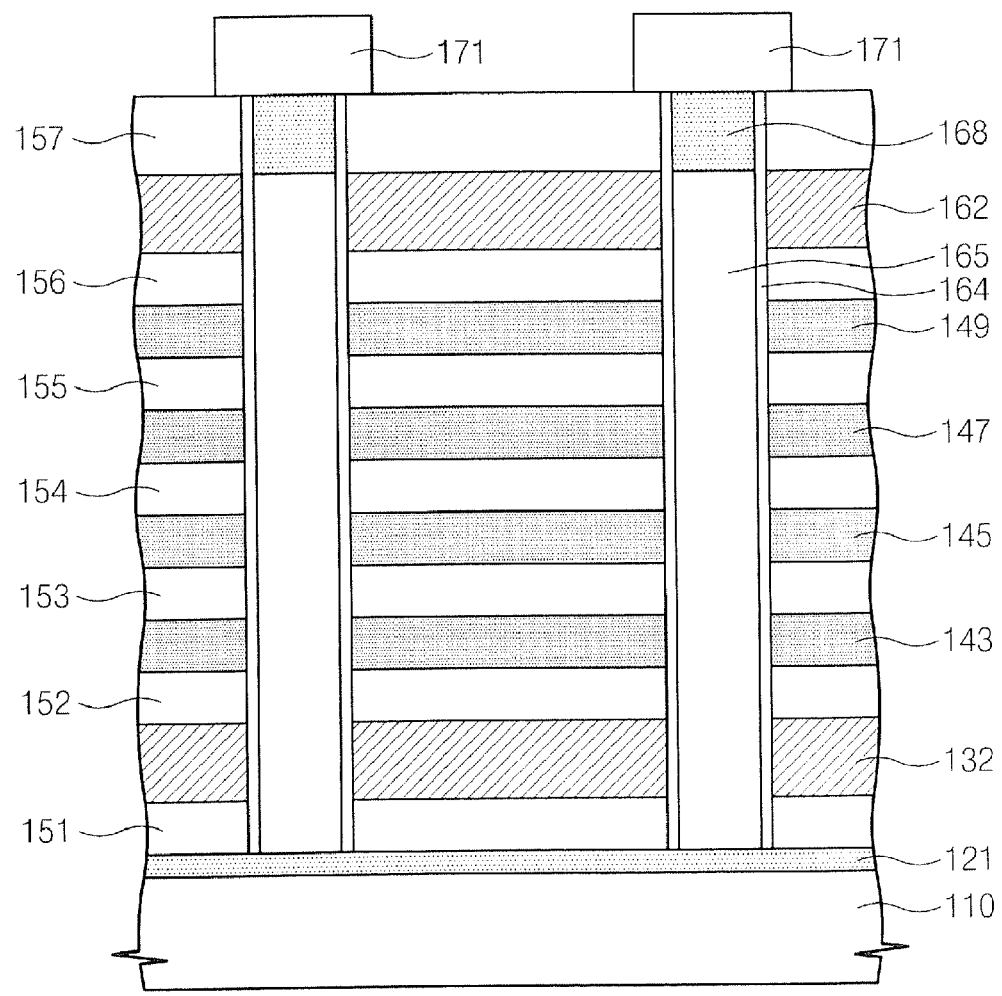
FIG. 2 is a cross-sectional view of a three-dimensional semiconductor device according to some embodiments of the present invention.

A three-dimensional semiconductor device according to some embodiments of the present invention will now be described with reference to FIGS. 1 and 2. FIG. 1 is a top plan view of a three-dimensional semiconductor device according to some embodiments of the present invention, and FIG. 2 is a cross-sectional view taken along the line I-I' in FIG. 1.

A vertical channel pattern 165 may be disposed on a substrate 110. The substrate may be a microelectronic substrate such as a semiconductor substrate based on a semiconductor. The substrate 110 may include a well region which may contain dopants of first conductivity type. The vertical channel pattern 165 may extend along the z-axis which is substantially vertical to the substrate 110. One end of the vertical channel pattern 165 may be connected to the well region, and the other end thereof may be electrically connected to a bitline 171 which will be explained later. The vertical channel pattern 165 may be a pillar-type pattern such as, for example, a filled pillar. Alternatively, the vertical channel pattern 165 may have an inner space therein. In this case, an insulating layer may fill the inner space of the vertical channel pattern 165. The vertical channel pattern 165 may include a semiconductor material. For example, the vertical channel pattern 165 may include a single-crystalline semiconductor.

A common source region 121 may be disposed within the substrate 110 to be electrically connected to the vertical channel pattern 165. The common source region 121 may be provided in form of a plate disposed within a cell region of the substrate 110 which includes a region between the substrate 100 and the vertical channel pattern 165. The common source region 121 may have other forms to be electrically connected to the vertical channel pattern 165. For example, the common source region 121 may not be sandwiched between the substrate 110 and a bottom surface of the vertical channel pattern 165 while being in contact with a sidewall of the vertical channel pattern 165. The vertical channel pattern 165 may be in contact with the well region. In this case, a portion of the vertical channel pattern 165 may be disposed within the substrate 110.

The common source region 121 may include relatively high-concentration dopants compared to the well region, which may have a second conductivity type different from that of the dopants contained in the well region. For example, in the case where the well region contains P-type dopants, the common source region 121 may include N-type dopants with higher concentration than the concentration of the P-type dopants.

A ground select gate pattern 132, a plurality of cell gate patterns 143, 145, 147, and 149, and string select gate patterns 162 may be stacked on the substrate 110. The gate patterns 132, 143, 145, 147, 149, and 162 may be stacked on the substrate 110 along a sidewall of the vertical channel pattern 165. The gate patterns 132, 143, 145, 147, 149, and 162 stacked along one sidewall of the vertical channel pattern 165 may constitute a vertical cell string.

The cell gate patterns 143, 145, 147, and 149 may be plate types that are parallel with the substrate 110. Although four cell gate patterns are shown in the figures for the convenience of explanation, the number of cell gate patterns is not limited thereto. The cell gate patterns 143, 145, 147, and 149 may constitute wordlines, respectively. The wordlines may be connected to global wordlines GWL by wordline contacts WC, respectively. The wordline contacts WC may be formed at the edge of a cell array.

Cell intergate dielectrics 153, 154, and 155 may be sandwiched between the cell gate patterns (143 and 145), (145 and 147), and (147 and 149), respectively. The cell intergate dielectrics 153, 154, and 155, the cell gate patterns 143, 145, 147, and 149 may be spaced apart from each other. Each of the cell intergate dielectrics 153, 154, and 155 may contain oxide.

The ground select gate pattern 132 may be disposed between the substrate 110 and the lowermost cell gate pattern 143. The ground select gate pattern 132 may be disposed on the substrate 100, in form of a plate. The ground select gate pattern 132 may control an electrical connection between the vertical channel pattern 165 and the well region within the substrate 110.

The string select gate pattern 162 may be disposed on the substrate 110 over the cell gate patterns 143, 145, 147, and 149. The string select gate pattern 162 may be stacked on the uppermost cell gate pattern 149. The string select gate pattern 162 may be a linear pattern, which may extend in a first direction (e.g., x-axis direction) running parallel to the substrate 110.

Intergate dielectrics 152 and 156 may be sandwiched between the select gate pattern 132 and the cell gate pattern 143 and between the select gate patterns 132 and 162 and the cell gate patterns 143, 145, 147, and 149. The intergate dielectrics 152 and 156 may be disposed on and beneath the cell gate patterns 143, 145, 147, and 149, making the cell gate patterns 143, 145, 147, and 149 spaced apart from the select gate patterns 132 and 162.

A bitline 171 may be disposed on the string select gate pattern 162. The bitline 171 may cross the string select gate pattern 162. That is, the bitline 171 may extend in a second direction (e.g., y-axis direction) intersecting the first direction (e.g., x-axis direction) in which the string select gate pattern 253 extends. In some embodiments, the first direction and the second direction may be perpendicular to each other. A string select insulting layer 157 may be disposed between the string select gate pattern 162 and the bitline 171.

The bitline 171 may be connected to a drain region 168 in an upper portion of the vertical channel pattern 166. The drain region 168 may be a heavily doped region in the upper portion of the vertical channel pattern 165. Moreover, in other embodiments, the bitline 171 may be connected to the drain region 168 by a plug. An electrical connection between the bitline 171 and the vertical channel pattern 165 may be controlled by the string select gate pattern 162.

At least one of the select gate patterns 132 and 162 may include a material having a work function which is different from those of at least one of the cell gate patterns 143, 145, 147, and 149. In some embodiments, all of the cell gate patterns 143, 145, 147, and 149 may contain a material having a work function which is different from those of the ground select gate pattern 132 and the string select gate pattern 162. Moreover, the work function of the select gate patterns may themselves be the same or may be different from one another. As understood by those having skill in the art, a work function is the minimum energy (usually measured in electron volts) needed to remove an electron from a solid to a point immediately outside the solid surface (or energy needed to move an electron from the Fermi energy level into vacuum).

For example, when charges stored during a program operation of a cell string including the select gate patterns 132 and 162 and the cell gate patterns 143, 145, 147, and 149 are electrons, a work function of the select gate pattern(s) may be greater than that of the cell gate pattern(s). Meanwhile, for example, when charges stored during a program operation of the cell string are holes, a work function of the select gate pattern(s) may be smaller than that of the cell gate pattern(s). The select gate patterns 132 and 162 may contain metals having work functions which are different from those of the cell gate patterns 143, 145, 147, and 149, respectively. Alternatively, the select gate patterns 132 and 162 and the cell gate patterns 143, 145, 147, and 149 may include dopants of different conductivity types. For example, the cell gate patterns 143, 145, 147, and 149 may include a semiconductor doped with N-type dopants, while the select gate patterns 132 and 162 may include a semiconductor doped with P-type dopants.

During a program operation, if a work function of a gate of a select transistor decreases when stored charges are electrons, a threshold voltage of the select transistor may drop. Thus, leakage current may be generated at select transistors. Because the leakage current prevents suitable boosting of the cell string during a program inhibit operation, a write error may occur. However, since the select gate patterns 132 and 162 according to embodiments of the present invention may have a high work function, generation of the leakage current may be suppressed and the cell string may be effectively boosted. As a result, a write error may be dramatically reduced, which can provide a semiconductor device having an improved reliability.

Charge storage patterns 164 may be sandwiched between the vertical channel pattern 165 and the respective cell gate patterns 143, 145, 147, and 149. Each of the charge storage patterns 164 may be provided in form of a tube penetrating the cell gate patterns 143, 145, 147, and 149 and the select gate patterns 132 and 162. The charge storage pattern 164 may be formed to surround the vertical channel pattern 165. Alternatively, the charge storage pattern 164 may take various forms according to the forms of the cell gate patterns 143, 145. 147, and 149.

The charge storage pattern 164 may include a blocking insulating layer adjacent to the cell gate patterns 143, 145, 147, and 149, a tunnel insulating layer adjacent to the vertical channel pattern 165, and a charge storage layer sandwiched between the blocking insulating layer and the tunnel insulating layer. The charge storage layer may contain at least one selected from the group consisting of undoped semiconductor, doped semiconductor, nitride of a group IV element, oxynitride of a group IV element, metal oxide, metal quantum dot, and metal. The charge storage layers disposed between the vertical channel pattern 165 and the cell gate patterns 143, 145, 147, and 149 may be isolated from one another. The blocking insulating layer may include an insulating material having a higher dielectric constant than an insulating material contained in the tunnel insulating layer.

A select gate insulating layer may be sandwiched between the vertical channel pattern and the select gate pattern. The select gate insulating layer may include the same material as the charge storage pattern 164. For example, the select gate insulating layer may be a portion of the charge storage pattern 164.

The ground select gate pattern, the cell gate pattern, and the string select gate patterns may be line types extending in the first direction (x-axis direction).

Figure 3:
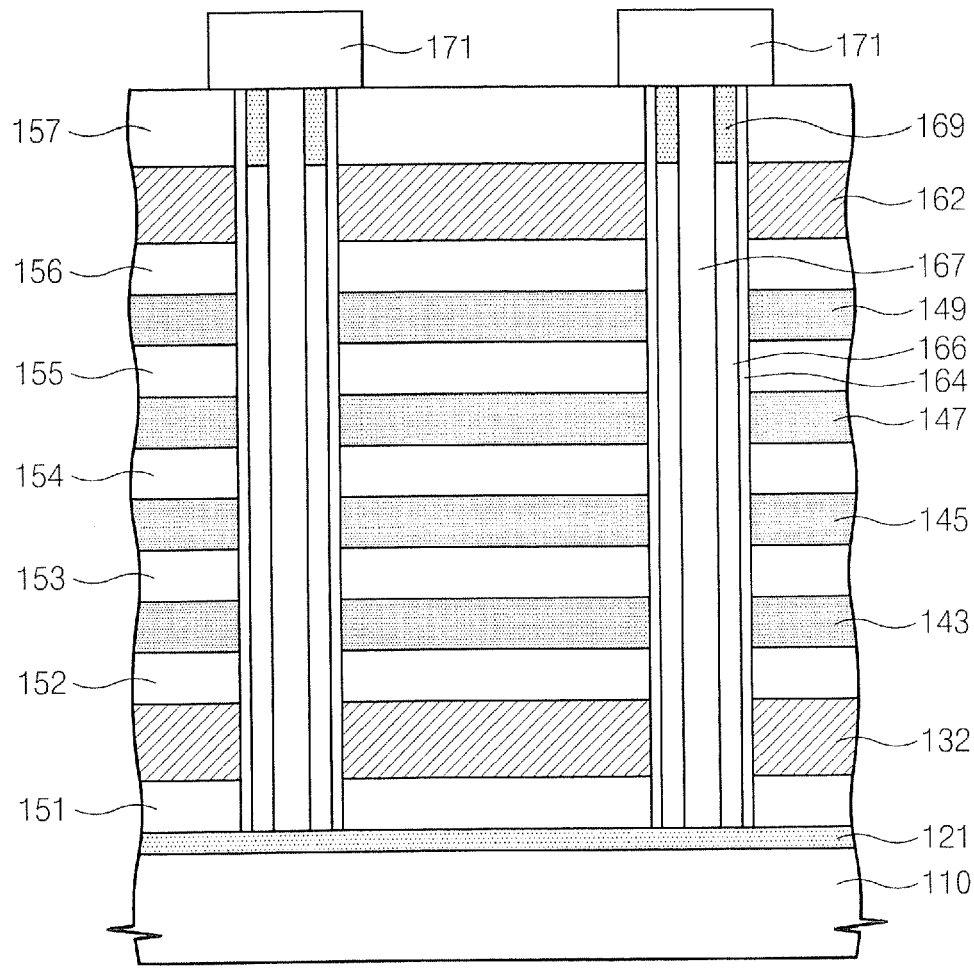
FIG. 3 is a cross-sectional view of a three-dimensional semiconductor device according to other embodiments of the present invention.

A three-dimensional semiconductor device according to other embodiments of the present invention will now be described with reference to FIGS. 1 and 3. FIG. 3 is a cross-sectional view taken along the line I-I' in FIG. 1. A duplicate description in FIGS. 1 and 2 will be omitted herein for brevity of explanation.

A vertical channel pattern 166 is perpendicularly disposed on a substrate 110. A direction which the vertical channel pattern 166 extends may be substantially perpendicular to a top surface of the substrate 110. A drain region 169 may be disposed at a top end of the vertical channel pattern 166. Cell gate patterns 143, 145, 147, and 149 and select gate patterns 132 and 162 may be stacked along the sidewall of the vertical channel pattern 166. Insulating layers may be sandwiched between the gate patterns. Charge storage patterns may be sandwiched between the vertical channel pattern 166 and the respective cell gate patterns 143, 145, 147, and 149. The vertical channel pattern 166 and the charge storage pattern 164 may be tubular patterns, respectively. The vertical channel pattern 166 has a hollow space formed therein, which may be filled with an insulating pillar 167.

Methods of fabricating a three-dimensional semiconductor device according to some embodiments of the present invention will now be described with reference to FIGS. 4 to 7.

Figure 4:
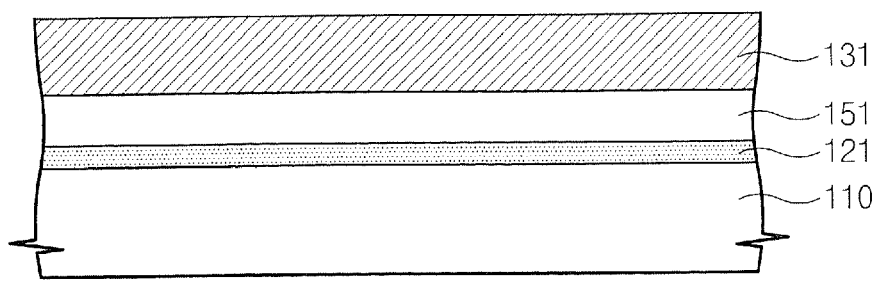
FIGS. 4 to 7 illustrate methods of fabricating a three-dimensional semiconductor device according to some embodiments of the present invention.

Referring to FIG. 4, a common source region 121 may be formed in the substrate 110, and a ground select insulating layer 151, and a ground select gate layer 131 may be sequentially formed on a substrate 110. The substrate 110 may be a microelectronic substrate, such as a semiconductor-based substrate, which may include an insulating region and/or an active region. The substrate 110 may include a well region, which may be formed by implanting dopants into the substrate 110. The implantation of the dopants may be conducted by means of a doping process including ion implantation and/or plasma doping.

The common source region 121 may be formed by implanting dopants into the well region. The common source region 121 may contain dopants of a conductivity type that is different from that of the well region. For example, the well region may contain P-type dopants while the common source region 121 may contain N-type dopants.

The substrate 110 and the ground select gate layer 131 may be spaced apart from each other by the ground select insulating layer 151. The string select insulating layer 151 may contain nitride, oxide and/or a combination thereof.

The ground select gate layer 131 may be formed to cover the entire surface of a cell region in the substrate 110. The ground select gate layer 131 may be formed of a conductive material. The ground select gate layer 131 may include, for example, a metal and/or a polycrystalline semiconductor material. In the case where the ground select gate layer 131 contains a polycrystalline semiconductor material, dopants may be further implanted into the ground select gate layer 131. Although the dopants contained in the ground select gate layer 131 may be implanted in-situ, their implantation is not limited thereto. In other embodiments, the ground select gate layer 131 is provided in form of a plate. However, the ground select gate layer 131 may be provided in form of a line by patterning the plate.

Figure 5:
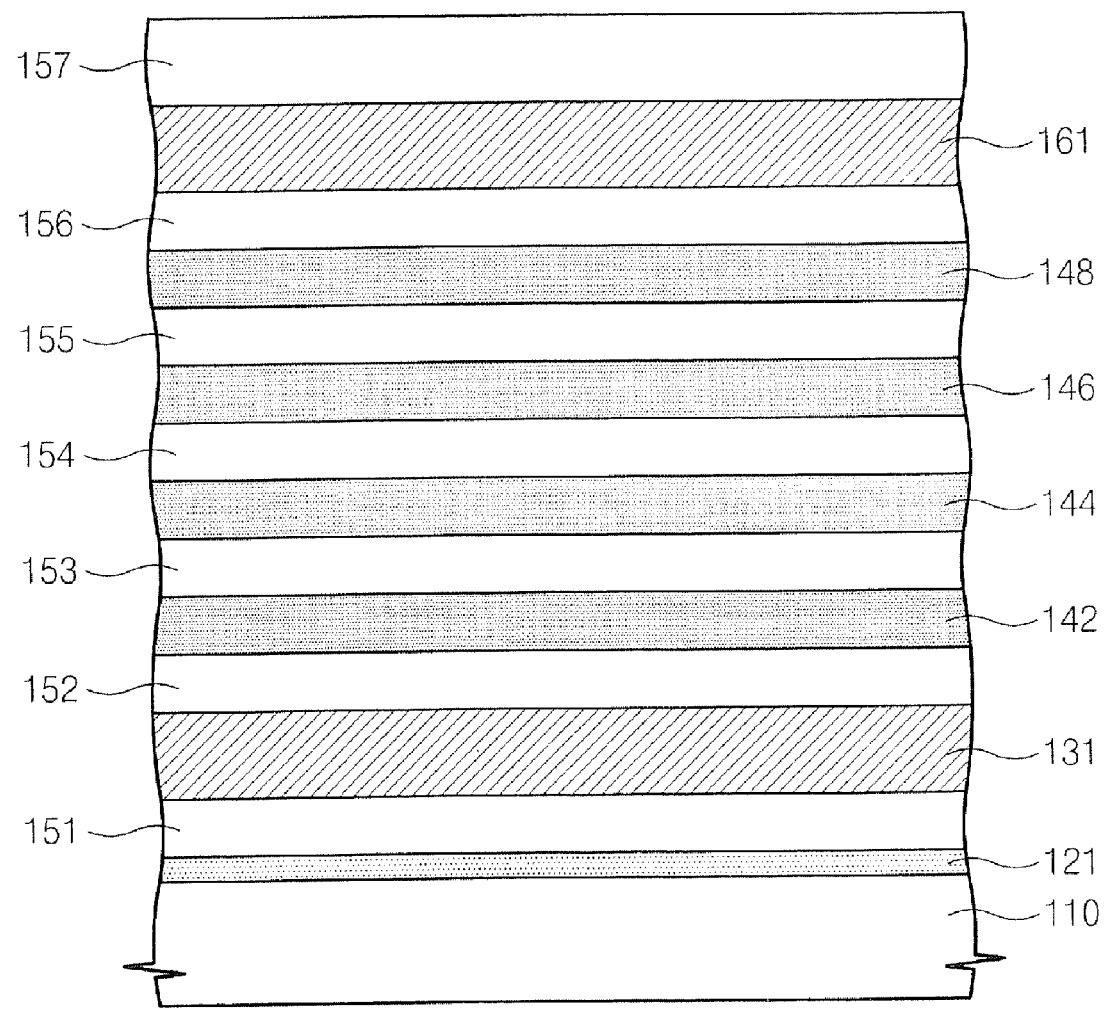

Referring to FIG. 5, an intergate dielectric 152 may be sandwiched between the ground select gate layer 131 and the cell gate layer 142. Cell gate layers 142, 144, 146, and 148 and cell intergate dielectrics 153, 154, and 155 may be formed on the integrate dielectric 152. The cell gate layers 142, 144, 146, and 148 and the cell intergate dielectrics 153, 154, and 155 may be alternately stacked. The cell gate layers 142, 144, 146, and 148 may include a conductive material. The cell gate layers 142, 144, 146, and 148 may include, for example, a metal and/or a doped polycrystalline semiconductor.

At least one of the cell gate layers 142, 144, 146, and 148 and the ground select gate layer 131 may include materials having different work functions each other. For example, in the case where the gate layers 131, 142, 144, 146, and 148 contain a doped polycrystalline semiconductor, the cell gate layers 142, 144, 146, and 148 may contain a semiconductor including N-type dopants and the ground select gate layer 131 may contain a semiconductor including P-type dopants. Alternatively, the cell gate layers 142, 144, 146, and 148 and the ground select gate layer 131 may contain metals having different work functions, respectively. The cell gate layers 142, 144, 146 and 148 may all have the same work function in some embodiments, whereas in other embodiments at least two of the cell layers 142, 144, 146 and 148 may have different work functions.

A string select gate layer 161 may be formed on the cell gate layers 142, 144, 146, and 148. The string select gate layer 161 may be provided on the cell gate layers 142, 144, 146, and 148, in form of a line. The string select gate layer 161 may be in form of a line extending in a first direction.

The string select gate layer 161 may include materials having work functions which are different from those of materials contained in at least one of the cell gate layers 142, 144, 146, and 148. For example, the string select gate layer 161 may include a different metal from the cell gate layers 142, 144, 146, 148 and/or a semiconductor doped with a dopant of a different conductivity type therefrom. Specifically, in the case where the cell gate layers 142, 144, 146, and 148 include a semiconductor including N-type dopants, the string select gate layer 161 may include a polycrystalline semiconductor including P-type dopants. In some embodiments, the string select gate layer 161 may include the same material and/or the same work function as the ground select gate layer 131. An intergate dielectric 156 may be formed between the string select gate layer 161 and the respective cell intergate layers 142, 144, 146, and 148. A string select insulating layer 157 may be formed over the string select gate layer 161.

Figure 6:
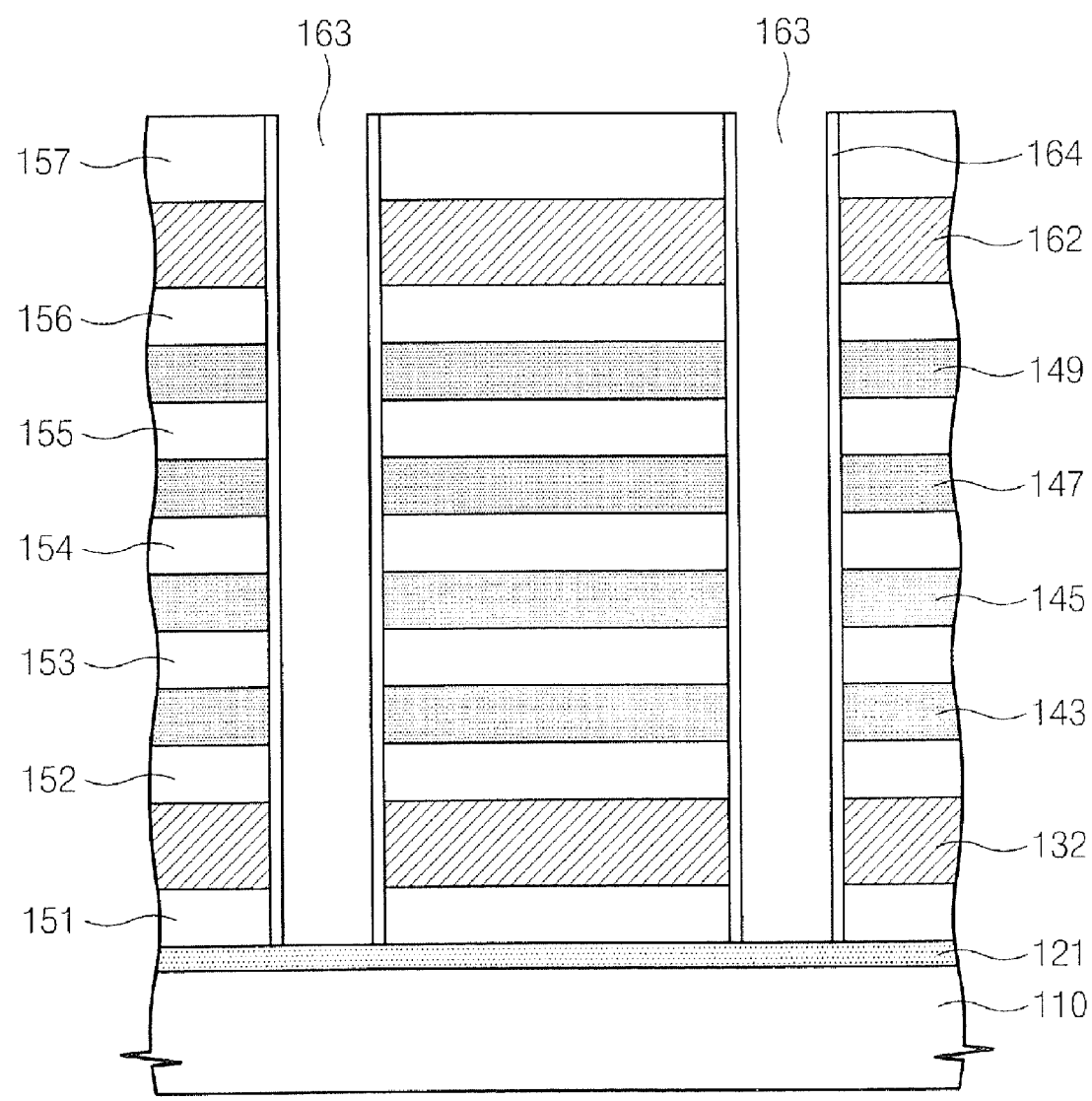

Referring to FIG. 6, an opening 163 may be formed to expose the common source region 121 by anisotropically etching the gate layers 131, 142, 144, 146, 148, and 161 and the insulating layers 151, 152, 153, 154, 155, 156, and 157 therebetween. Cell gate patterns 143, 145, 147, and 149 and select gate patterns 132 and 162 may be formed on the substrate 110 by etching the gate layers 131, 142, 144, 146, 148, and 161. During the anisotropic etching, the cell gate patterns 143, 145, 147, and 149 and the select gate patterns 132 and 162 exposed into the opening 163 may be recessed more laterally than the insulating layers 151, 152, 153, 154, 155, 156, and 157. This is because an etch rate of the insulating layers between the gate layers is lower than that of the gate layers. Process conditions may control whether the gate patterns are recessed or not. Alternatively, following formation of the opening 163, an etching process may be additionally performed using an etchant having an etch selectivity with respect to the gate layers.

A charge storage pattern 164 may be formed within the opening 163. The charge storage pattern 164 may include a barrier insulating layer adjacent to the cell gate patterns 143, 145, 147, and 149, a charge storage layer contacting the barrier insulating layer, and a tunnel insulating layer contacting the charge storage layer. The charge storage layer may contain at least one selected from the group consisting of undoped semiconductor, doped semiconductor, semiconductor nitride, semiconductor oxynitride, metal oxide, metal quantum dot, and metal. The blocking insulating layer may have a higher dielectric constant than the tunnel insulating layer.

Moreover, in the case where the charge storage layer includes a conductive material, charge storage layer may be include a plurality of layers that are separated from each other. In this case, the plurality of layers may be disposed between the vertical channel pattern 165 and the respective cell gate patterns 143, 145, 147, and 149 that are separated from each other. Specifically, after the charge storage layer and/or the blocking insulating layer is conformally formed in a wall of the opening 160, a removing process may be performed to remove a portion of the charge storage layer and/or the blocking insulating layer. The removing process may include removing a charge storage layer and/or a blocking insulating layer formed on the above-mentioned protruding insulating layers 151, 152, 153, 154, 155, 156, and 157. The removal of a portion of the charge storage layer and/or the blocking insulating layer may include performing a dry etching process.

Figure 7:
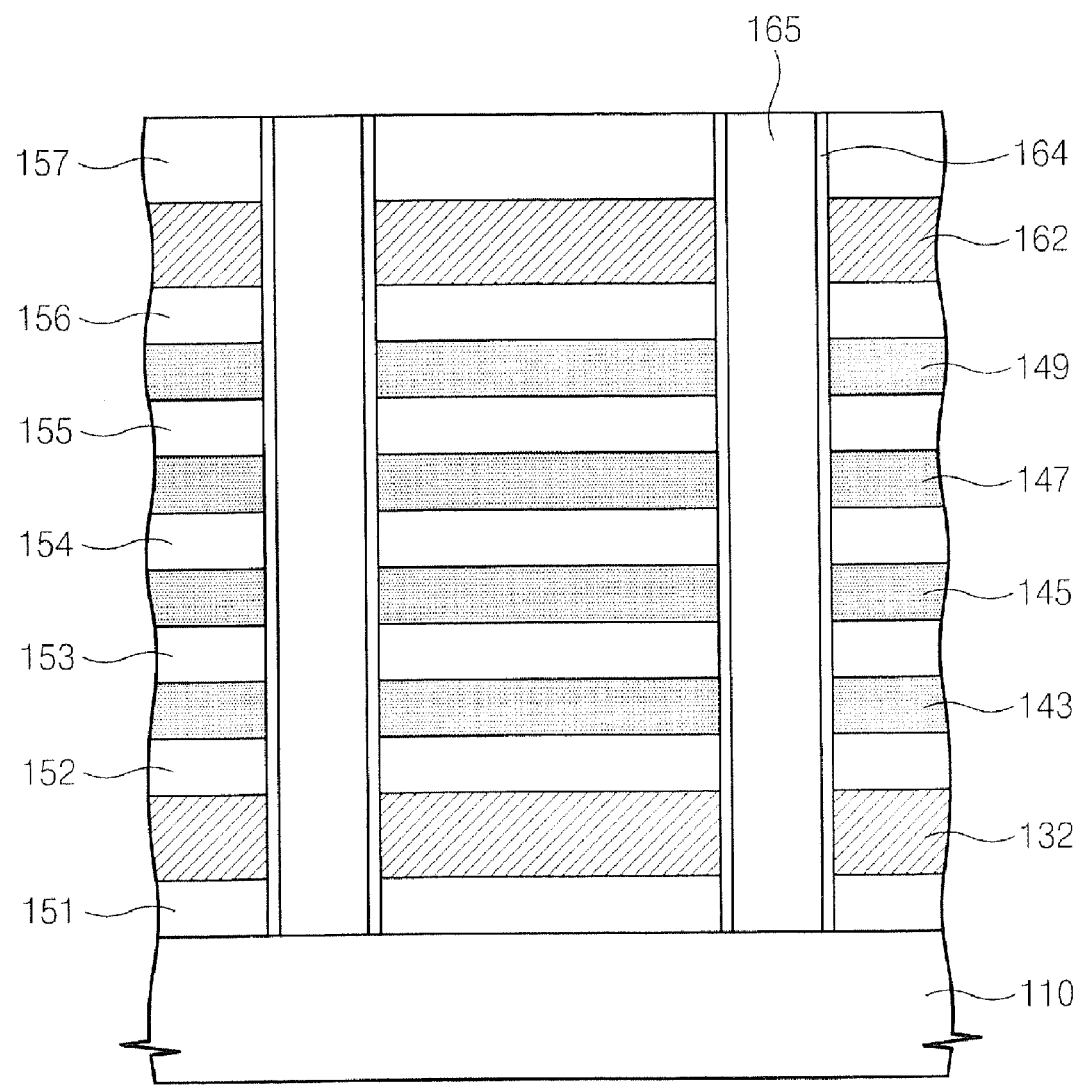

Referring to FIG. 7, a vertical channel pattern 165 may be formed to fill the opening 163. Although the vertical channel pattern 165 may contain a single-crystalline semiconductor, it is not limited thereto. In the case where the vertical channel pattern 165 includes a single-crystalline semiconductor, the vertical channel pattern 165 may be formed by epitaxial growth using the substrate as a seed layer. Alternatively, the vertical channel pattern 165 may be formed by forming a spacer containing a polycrystalline semiconductor on the sidewall of the opening 160 and changing a phase of the polycrystalline semiconductor. In this case, an insulating pillar may be further formed to fill an inner space defined by the vertical channel pattern 165.

Returning to FIG. 2, a drain region 168 may be formed on the vertical channel pattern 165. The drain region 168 may be formed by doping an upper portion of the vertical channel pattern 165. The drain region 168 may be a region heavily doped with dopants of a conductivity type which is different from that of the well region. For example, the drain region 168 may include high concentration N-type dopants.

A bitline 171 may be formed on the string select gate pattern 162. The bitline 171 crosses the string select gate pattern 162 and is electrically connected to the drain region 168. The bitline 171 may be formed by forming a conductive layer on the string select gate pattern 162 and performing an anisotropic etching process using an etch mask formed in a direction crossing the string select gate pattern 162.

Figure 8:
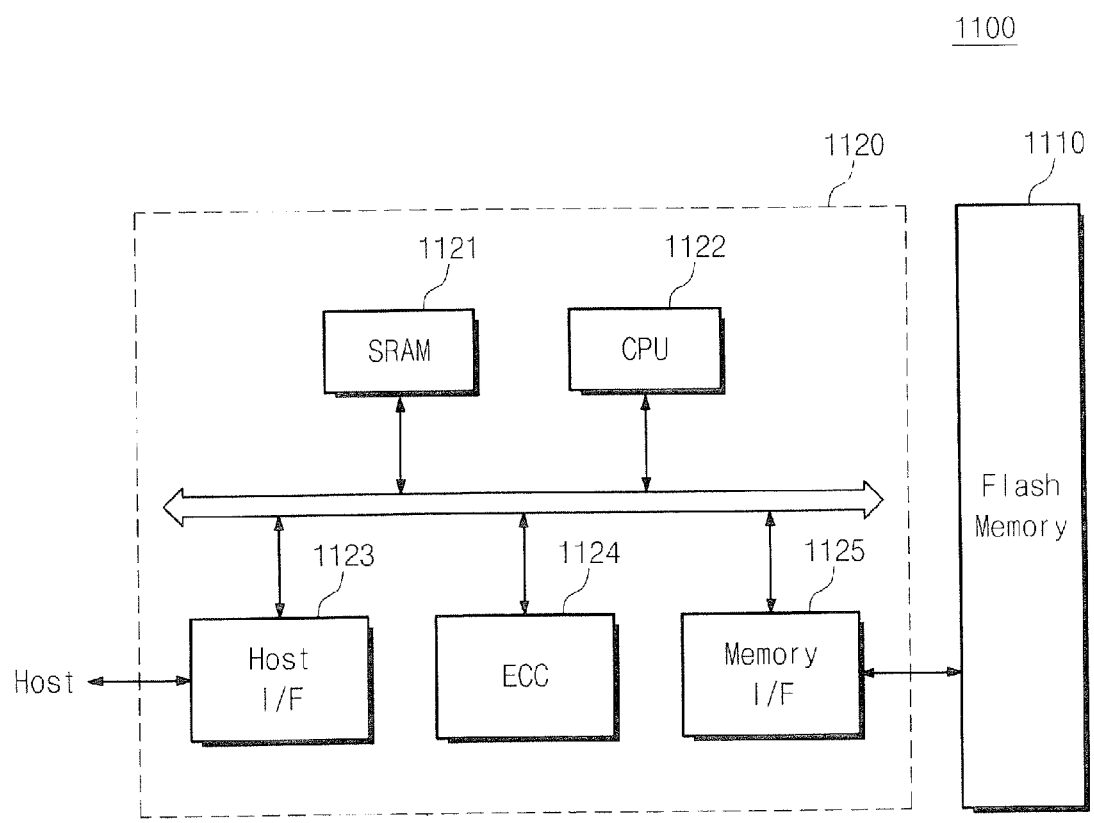
FIGS. 8 and 9 illustrate applications of embodiments of the present invention.

An application of the embodiments of the present invention will now be described with reference to FIG. 8. FIG. 8 is a block diagram illustrating an example of a memory card 1100 including a three-dimensional semiconductor device according to some embodiments of the present invention. The three-dimensional semiconductor device may be applied to a flash memory 1110. A three-dimensional semiconductor device may be mounted in the memory card 1100 for supporting storage of high-capacity data. The memory card 1100 may include a memory controller 1120 configured to control data exchange between a host and the flash memory 1110.

The memory controller 1120 may include a processing unit (CPU) 1122 configured to control operations of a memory card, an SRAM 1121, an error correction code block (ECC) 1124, a host interface (I/F) 1123, and a memory interface (I/F) 1125. The SRAM 1121 may act as an operation memory of the processing unit 1122. The host interface 1123 may include a data exchange protocol of a host connected to the memory card 1100. The ECC 1124 may be configured to detect and correct an error included in data read out of the flash memory 1110. The memory interface 1125 may be configured to interface with the flash memory 1110. The processing unit 1122 may be configured to perform control operations for data exchange of the memory controller 1120. The memory card 1100 may provide a highly-reliable system due to improved reliability of the flash memory 1110.

Figure 9:
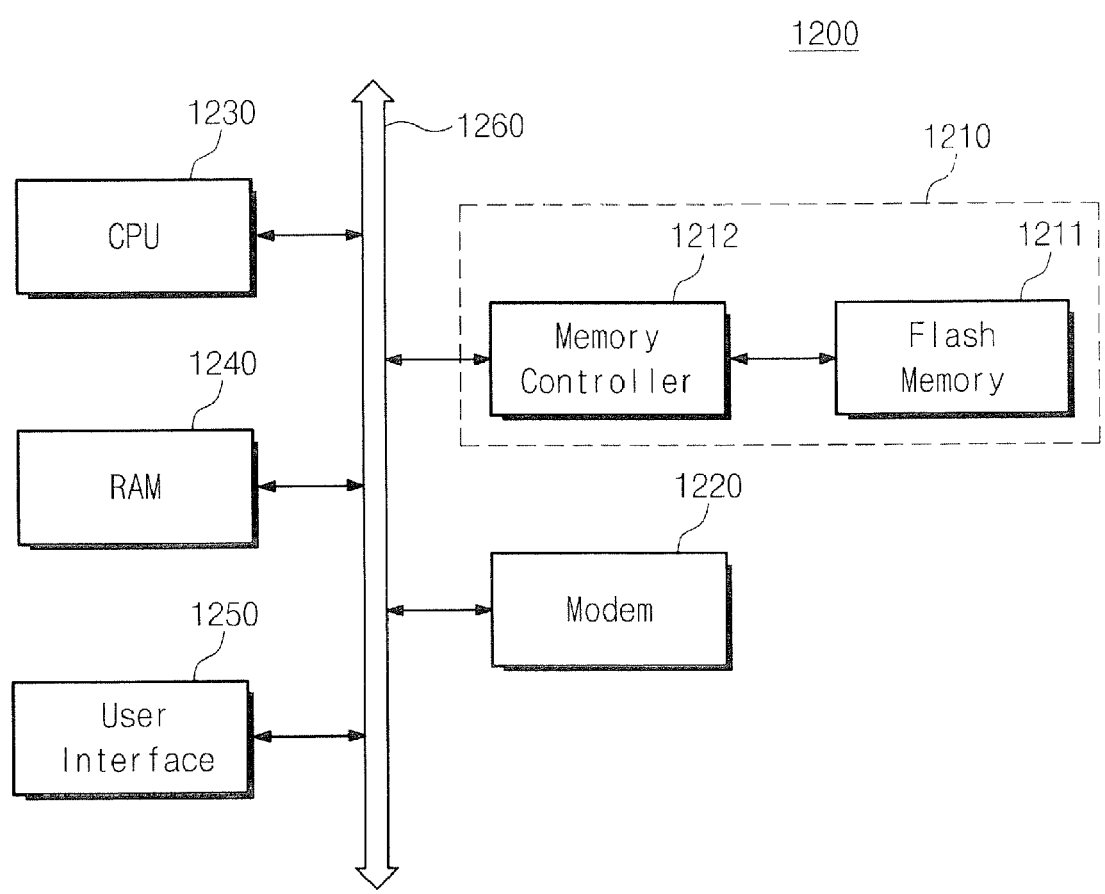

Another application of a three-dimensional semiconductor device according to some embodiments of the present invention will now be described with reference to FIG. 9. FIG. 9 is a block diagram of a data processing system 1200 including a memory system 1210. Three-dimensional semiconductor devices according to embodiments of the present invention may be included in the memory system 1210 as flash memory 1211. The memory system 1210 may be mounted in a data processing system such as a mobile device or a desktop computer and may also include a memory controller 1212. The data processing system 1200 according to the application of the present invention may include the memory system 1210 and a modem 1220, a central processing unit (CPU) 1230, a RAM 1240, and a user interface 1250 which are electrically connected to a system bus 1260. Data processed by the CPU 1230 or externally input data may be stored in the memory system 1210. The memory system 1210 may constitute a solid-state disk/drive (SSD). In this case, the data processing system 1200 may stably store high-capacity data in the memory system 1210. Moreover, with the improvement in reliability of the foregoing semiconductor device, the memory system 1210 may reduce resources required in error correction. Thus, a high-speed data exchange function may be provided to the data processing system 1200.

Three-dimensional semiconductor devices according to embodiments of the present invention may be mounted using various forms of packages. The three-dimensional semiconductor device of the present invention may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP). System In Package (SIP), Multi Chip Package (MCP), Wafer-level Fabricated Package (WFP) and/or Wafer-Level Processed Stack Package (WSP).

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A three-dimensional semiconductor device comprising:
    a substrate;
    a vertical channel pattern on the substrate;
    a plurality of cell gate patterns and a select gate pattern stacked on the substrate along a sidewall of the vertical channel pattern;
    a charge storage pattern between the vertical channel pattern and the cell gate patterns;
    a ground select gate pattern between the substrate and a lowermost pattern among the cell gate patterns; and a select gate pattern insulating layer between the vertical channel pattern and the select gate pattern, wherein the select gate pattern has a different work function from the cell gate patterns, and wherein the select gate pattern is stacked on an uppermost pattern among the cell gate patterns and extends in a first direction.

2. The three-dimensional semiconductor device of claim 1, wherein the work function of the select gate pattern is greater than that of the cell gate pattern when charges stored in the charge storage pattern during a program operation are electrons.

3. The three-dimensional semiconductor device of claim 1, wherein the cell gate pattern and the select gate pattern include semiconductors doped with dopants of different conductivity types respectively.

4. The three-dimensional semiconductor device of claim 3, wherein the cell gate pattern includes N-type dopants and the select gate pattern includes P-type dopants when charges stored in the charge storage pattern during a program operation are electrons.

5. The three-dimensional semiconductor device of claim 1, wherein the charge storage pattern includes a blocking insulating layer adjacent to the cell gate patterns, a tunnel insulating layer adjacent to the vertical channel pattern, and a charge storage layer between the blocking insulating layer and the tunnel insulating layer.

6. The three-dimensional semiconductor device of claim 1, further comprising:
a bitline disposed over the select gate pattern and extending in a second direction which is perpendicular to the first direction.

7. The three-dimensional semiconductor device of claim 1, wherein the charge storage pattern and the select gate insulating layer contain the same material.

8. The three-dimensional semiconductor device of claim 1, further comprising:
insulating layers sandwiched between the cell gate patterns and the select gate pattern, respectively.

9. A three-dimensional semiconductor device comprising:
a substrate;
a vertical channel pattern on the substrate;
a plurality of cell gate patterns and a select gate pattern stacked on the substrate along a sidewall of the vertical channel pattern;
a charge storage pattern between the vertical channel pattern and the cell gate patterns; and
a ground select gate pattern between the substrate and a lowermost pattern among the cell gate patterns, wherein the ground select gate pattern has a different work function from at least one of the cell gate patterns,
wherein the select gate pattern has a different work function from at least one of the cell gate patterns, and
wherein the select gate pattern is a string select gate pattern that is stacked on an uppermost pattern among the cell gate patterns.

10. The three-dimensional semiconductor device of claim 9, wherein the work function of the string select gate pattern is greater than that of the at least one cell gate pattern when charges stored in the charge storage pattern during a program operation are electrons.

11. The three-dimensional semiconductor device of claim 9, wherein the at least one cell gate pattern and the string select gate pattern include semiconductors doped with dopants of different conductivity types respectively.

12. The three-dimensional semiconductor device of claim 11, wherein the at least one cell gate pattern includes N-type dopants and the string select gate pattern includes P-type dopants when charges stored in the charge storage pattern during a program operation are electrons.

13. The three-dimensional semiconductor device of claim 9, wherein the charge storage pattern includes a blocking insulating layer adjacent to the cell gate patterns, a tunnel insulating layer adjacent to the vertical channel patterns, and a charge storage layer between the blocking insulating layer and the tunnel insulating layer.

14. The three-dimensional semiconductor device of claim 9, further comprising:
a bitline disposed over the string select gate pattern.

15. The three-dimensional semiconductor device of claim 9, wherein the charge storage pattern and the select gate insulating layer contain the same material.

16. The three-dimensional semiconductor device of claim 9, wherein the string select gate pattern and the ground select gate pattern both have work functions that are different from all of the cell gate patterns.

* * * * *